United States Patent [19]

Kida

[11] Patent Number: 5,512,842
[45] Date of Patent: Apr. 30, 1996

[54] HIGH ACCURACY INSPECTION METHOD AND APPARATUS OF SEMICONDUCTOR INTEGRATED CIRCUITS

[75] Inventor: Tomoyuki Kida, Tokyo, Japan

[73] Assignee: NEC Corporation, Tokyo, Japan

[21] Appl. No.: 340,870

[22] Filed: Nov. 15, 1994

[30] Foreign Application Priority Data

Dec. 1, 1993 [JP] Japan .................................. 5-301397

[51] Int. Cl.⁶ .................................................. G01R 31/26
[52] U.S. Cl. .......................................... 324/765; 324/537
[58] Field of Search ..................................... 324/537, 754, 324/759, 765, 158.1

[56] References Cited

U.S. PATENT DOCUMENTS

| | | | |
|---|---|---|---|
| 4,746,856 | 5/1988 | Allred, Jr. et al. | 324/765 |
| 5,235,271 | 8/1993 | Kira | 324/765 |

*Primary Examiner*—Ernest F. Karlsen
*Assistant Examiner*—Russell M. Kobert
*Attorney, Agent, or Firm*—Whitham, Curtis, Whitham & McGinn

[57] ABSTRACT

An inspection method and apparatus of semiconductor integrated circuits, in which a specification, a measuring system error in measurements and a number N of measurement repeat times are read in and a distance between parts of the semiconductor integrated circuit is measured to obtain measured value. The measured value is compared with the specification to execute a first non-defective/defective discrimination. The measured value determined to be defective by the first discrimination is further compared with a new discrimination reference obtained by adding the measuring system error to the specification to execute a second non-defective/defective discrimination. Against the semiconductor integrated circuits discriminated to be defective in the first discrimination and to be non-defective in the second discrimination, the measurement is carried out N times and an average value of the N number of measured values is calculated. This average value is further compared with the specification to execute a third non-defective/defective discrimination. As a result, the measuring system error components are averaged and thus a false notice rate of the essentially non-defective ICs can be reduced.

13 Claims, 6 Drawing Sheets

HIGH ACCURACY INSPECTION METHOD AND APPARATUS OF SEMICONDUCTOR INTEGRATED CIRCUITS

BACKGROUND OF THE INVENTION

The present invention relates to an inspection method and apparatus of semiconductor integrated circuits (ICs), and more particularly to an IC inspection method having a measurement error of more than a predetermined value with respect to dimensions of an inspectional objective event, that is, in the case where measurement accuracy of inspection means for measuring the inspectional objective event is not sufficiently small in comparison with the dimensions of the inspectional objective event and a shape inspection apparatus of the ICs.

DESCRIPTION OF THE RELATED ART

A conventional inspection method and shape inspection apparatus of ICs will now be described with reference to FIGS. 1 and 2 which illustrate a flowchart of an inspection method of the ICs and a shape inspection apparatus of lead terminals, respectively.

Figure 2:
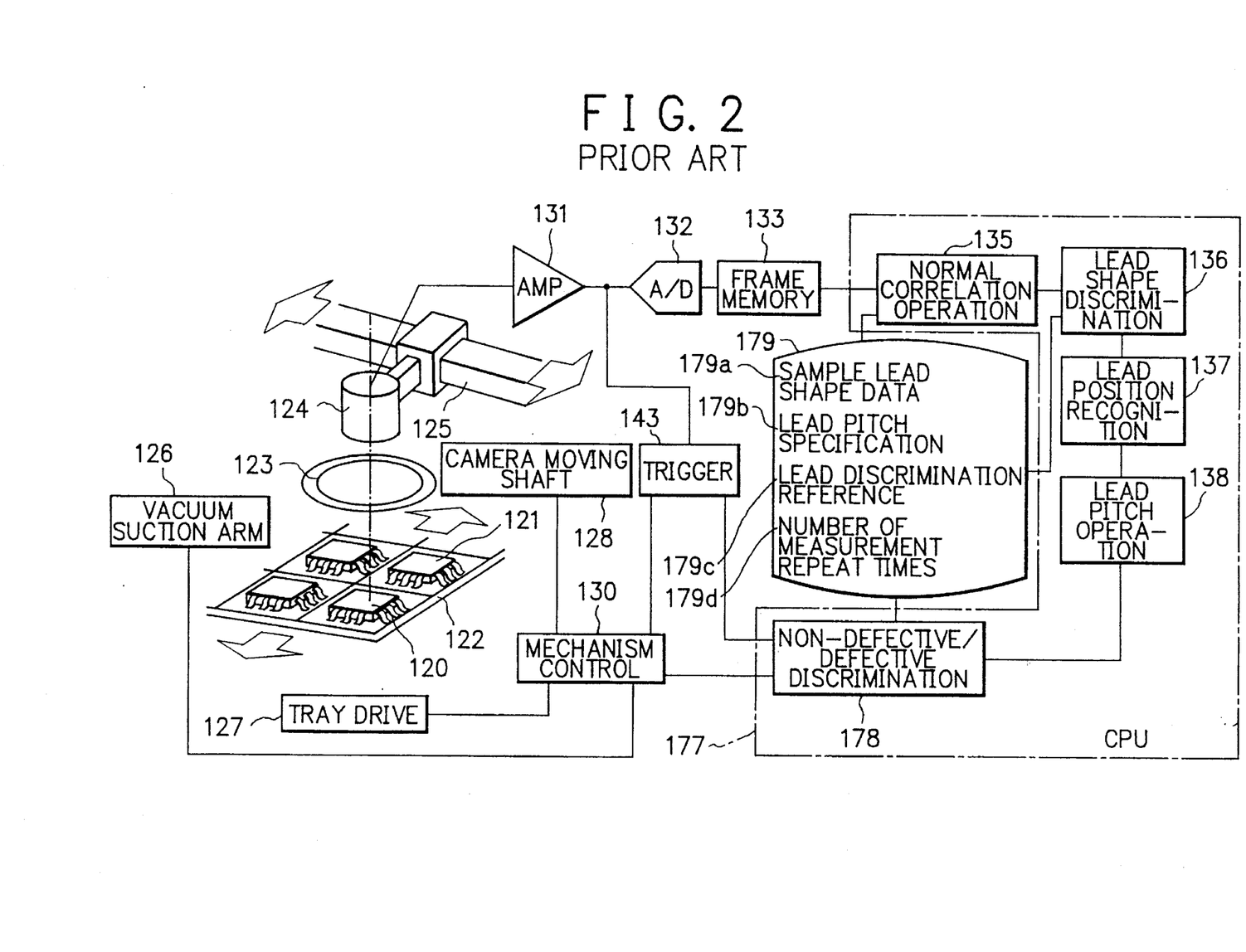
FIG. 2 is a block diagram of a conventional inspection apparatus for lead pitch measurement for embodying the conventional IC inspection method shown in FIG. 1.

As shown in FIG. 2, an objective IC 120 mounted on a tray 122 is subjected to irradiation of a pseudo natural light generated from a falling illumination source 123 and a camera 124 takes a reflected image of the IC 120. The image of the IC 120, picked up by the camera 124 is converted into signals which are input to an AMP (amplifier) 131 and the AMP amplifies the signals so as to adapt to an input level of an A/D (analog-digital) converter 132. A trigger circuit 143 supplies a start signal for a series of imaging work to the camera 124, the AMP 131 and the A/D converter 132 by an instruction of a CPU 177. The A/D converter 132 converts the image signals output from the AMP 131 into digital image signals which are to be stored as 8-bits multitone image data of 256 levels of gray in a frame memory 133. The CPU 177 includes a normal correlation operation part 135, a lead shape discrimination part 136, a lead position recognition part 137, a lead pitch operation part 138 and a non-defective/defective discrimination part 178. The normal correlation operation part 135 in the CPU 177 compares sample lead shape data 179a previously stored in an external storage device 179 with the multitone image data of the shape of the IC 120, which are stored in the frame memory 133, and calculates a correlation coefficient of each part of the multitone image data with respect to the sample lead shape data 179a.

The correlation coefficients between the multitone image data and the sample lead shape data 179a assign X–Y components to the memory sizes of two directions on the frame memory 133 corresponding to a two-dimensional image taken by the camera 124. Further, the correlation coefficients are multi-valued depending on a variable density level by the A/D converter 132 and allocate a Z component to the memory size (depth) on the frame memory 133. The image data of the total three faces, which are imaged by the camera 124 and are composed of the two-dimensional data are transformed into data groups composed of the three X, Y and Z axes and are expressed by the sum of squares of the correlation coefficients of the three axes of the faces.

The lead shape discrimination part 136 discriminates those exceeding a three axes of the faces.

The lead shape discrimination part 136 discriminates those exceeding a predetermined lead discrimination reference 179c as the leads from the correlation coefficients of the parts of the multitone image data calculated by the normal correlation operation part 135. The lead position recognition part 137 reads the X–Y coordinates within the frame memory 133 concerning four (rectangular) vertexes of the parts within the multitone image data, recognized as the leads by the lead shape discrimination part 136. The lead pitch operation part 138 recognizes two data of the lead tip parts from the coordinate data of the four vertexes of the leads that the lead position recognition part 137 read out, calculates the middle points of the two data and further calculates the difference between the adjacent two middle points as a lead pitch.

The non-defective/defective discrimination part 178 compares all the lead pitches calculated by the lead pitch operation part 188 with lead pitch specifications 179b (see steps 171 and 172 of FIG. 1) previously stored in the external storage device 179 and discriminates the IC 120 as either a non-defective when all the lead pitches of the IC 120 are below the lead pitch specifications 179b or a defective when at least one of the lead pitches is larger than the lead pitch specifications 179b.

In the case where the IC 120 is non-defective, by a signal output from the CPU 177 including the non-defective/defective discrimination part 178, a mechanism control part 130 gives instructions to a vacuum suction arm 126, a tray drive system 127 and a camera moving shaft system 128. In response to this instruction, the vacuum suction arm 126 keeps its stand-by state above this IC 120 without operating its vacuum suction. The tray drive system 127 moves the tray 122 forward and backward to position a next IC 121 below the camera 124. The camera moving shaft system 128 moves the camera 124 left and right along a camera moving shaft 125 only when the IC 120 whose measurement has just finished is the last within the tray 122 so as to position the next IC 121.

Figure 1:
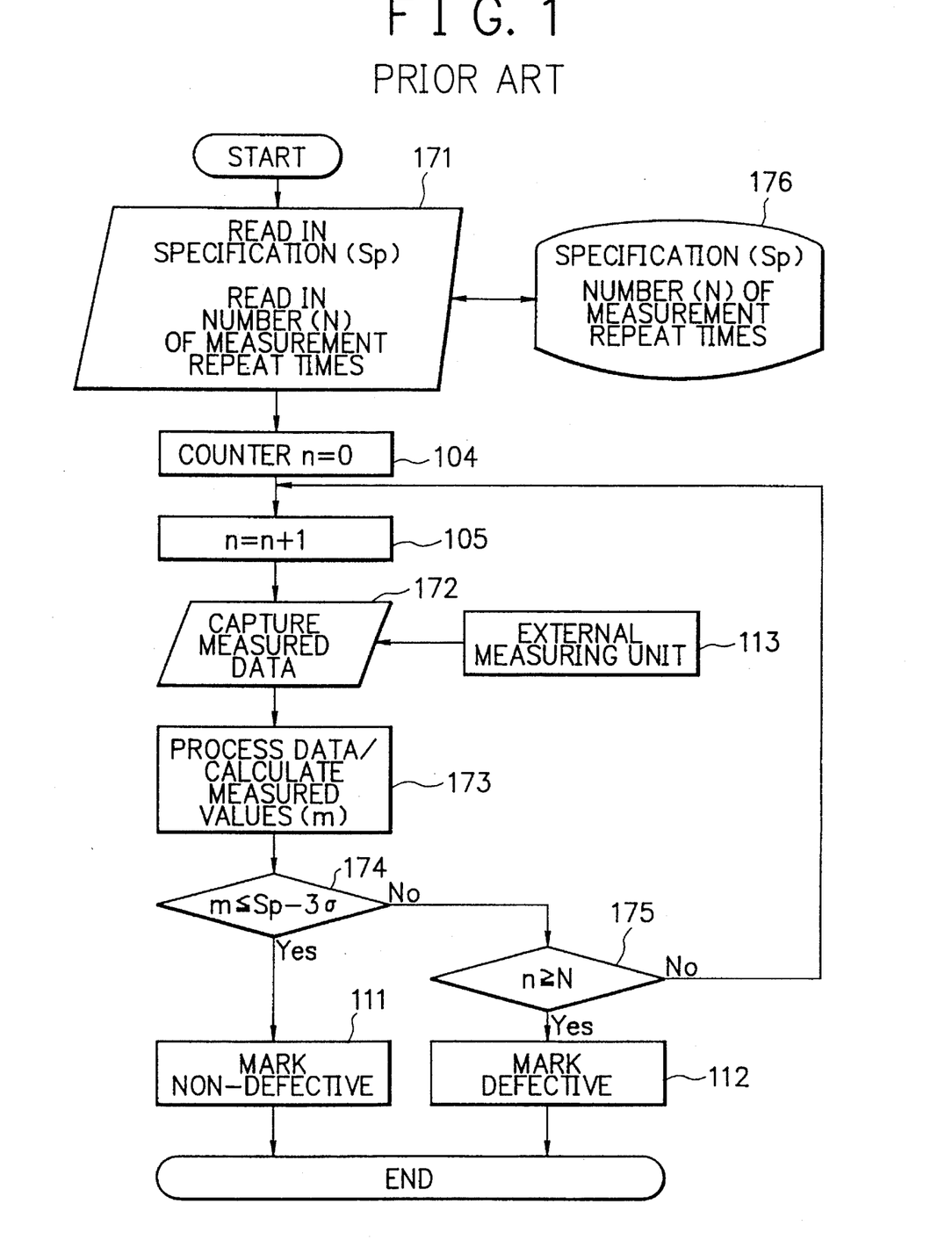
FIG. 1 is a flowchart showing a process of a conventional IC inspection method.

On the other hand, in the case where the IC 120 is defective, when the measurement just conducted is smaller than measurement repeat times 179d stored beforehand in the external storage device 179, the CPU 177 including the non-defective/defective discrimination part 178 outputs the signal to the trigger circuit 143 to instruct the remeasurement (see steps 104 and 105 of FIG. 1).

When the measurement has already reached the measurement repeat times 179d, the mechanism control part 130 gives the instructions to the vacuum suction arm 126, the tray drive system 127 and the camera moving shaft system 128 and the vacuum suction arm 126 adsorbs the IC 120, carries the IC 120 to a defective storage area out of the tray 122 and stores it there. The tray drive system 127 and the camera moving shaft system 128 operate in the same manner as described above.

The operation of the conventional shape inspection apparatus of the lead terminals, which is described above in connection with FIG. 2, corresponds to the process of the conventional inspection method shown in FIG. 1. That is, the mechanism control part 130, the tray drive system 127, the camera moving shaft system 128, the illumination source 123, the camera 124, the camera moving shaft 125, the mechanism control part 130, the AMP 131, the A/D converter 132 and the frame memory 133 operate corresponding to an external measuring unit 113 and a data capture step 172. Similarly, the vacuum suction arm 126 operates corresponding to a non-defective display step 111 and a defective display step 112, and the normal correlation operation part 135, the lead shape discrimination part 136, the lead position recognition part 137 and the lead pitch operation part 138 operate corresponding to a data processing/measured value calculation step 173, and the non-defective/defective discrimination part 178 and the trigger circuit 143 operate corresponding to two condition branch steps 174 and 175. The above-described parts correspond as an embodiment of the apparatus of the steps shown in FIG. 1.

However, in the conventional IC inspection method and apparatus shown in FIGS. 1 and 2, production ability (process ability for restricting characteristic dispersion of products to the minimum) in the inspectional objective event of the products and errors included in the measuring system are not considered and also the measuring system determines the defective or the non-defective condition using only a single specification (see steps 171 and 172 of FIG. 1).

Figure 3A:
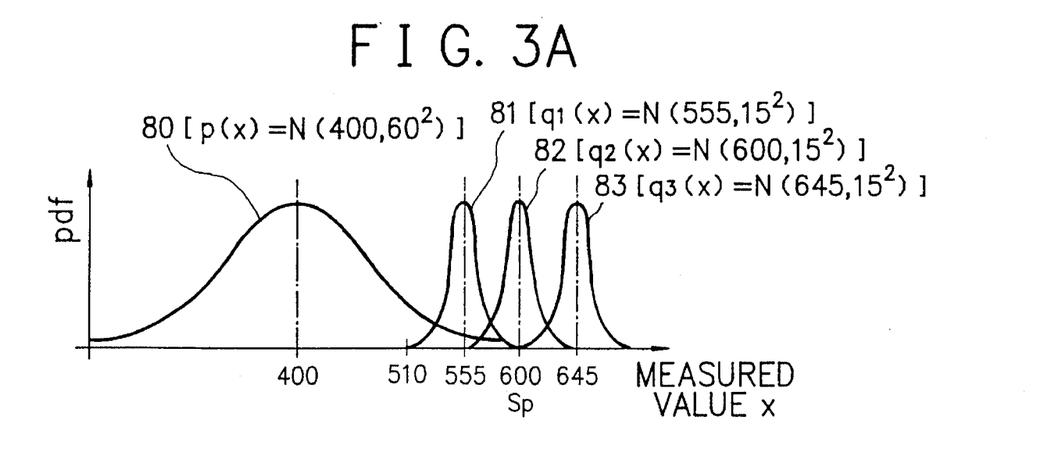
FIG. 3A is a graphical representation showing a relationship between probability density functions of basic measuring system errors and production ability.

For example, referring to FIG. 3A showing a relationship between probability density functions of the measuring system errors and the production ability, in the case where the lead pitch is inspected at repeat number 1 as an inspectional objective event, a probability density function (hereinafter referred to as 'pdf') of production ability 80 is expressed as follows:

$$p(x)=N(400 \text{ μm}, 60^2 \text{ μm})(N: \text{ normal distribution})$$

The pdf of a basic measuring system error is as follows:

$$q(x)=N(0 \text{ μm}, 15^2 \text{ μm})$$

Now, in order to limit a defective miss detection rate (defined as a consumer's risk rate in the probability theory) owing to only the measuring system against a guaranteed specification 600 μm for clients to 5% or less, when it is assumed that a modified formula $q1(x)$ of $q(x)$, wherein a discrimination specification of the measuring system is determined to 555 μm resulted from a subtraction of three times as much as variance of the aforementioned $q(x)$ from the guaranteed specification is expressed as follows.

$$q1(x)=N(555 \text{ μm}, 15^2 \text{ μm})$$

primarily, products having a value in a non-defective area of 510 μm to 555 μm against a discrimination reference of the measuring system are determined to be defective with the probability of formula (1).

$$MR1 = \int_{510}^{555} p(x) \cdot q1(x)ds \tag{1}$$

$$= \left\{ \phi\left(\frac{555-400}{60}\right) - \phi\left(\frac{510-400}{60}\right) \right\} \times$$

$$\phi\left(\frac{555-510}{15}\right)$$

$$= 1.43\%$$

Also, the products having a value in a defective area of 555 μm to 600 μm against the discrimination reference of the measuring system are determined to be defective with the probability of formula (2).

$$MR2 = \int_{555}^{600} p(x) \cdot q1(x)dx \tag{2}$$

$$= \left\{ \phi\left(\frac{600-400}{60}\right) - \phi\left(\frac{555-400}{60}\right) \right\} \times$$

$$\phi\left(\frac{600-555}{15}\right)$$

$$= 0.22\%$$

Further, the probability that the measuring system correctly determines to be defective against actual defectives beyond the guaranteed specification 600 μm is represented by formula (3).

$$MR3 = \int_{600}^{\infty} p(x) \cdot q1(x)dx \tag{3}$$

$$= \left\{ 0.5 - \phi\left(\frac{600-400}{60}\right) \right\} \times$$

$$\left\{ \phi\left(\frac{600-555}{15}\right) + 0.5 \right\}$$

$$\approx 0.04\%$$

Against the complete non-defectives of 510 μm or less, the defectives shown in formula (4) arise.

$$MR4 = \int_{-\infty}^{510} p(x) \cdot q1(x)dx \tag{4}$$

$$= \left\{ 0.5 + \phi\left(\frac{510-400}{60}\right) \right\} \times$$

$$\left\{ 0.5 - \phi\left(\frac{555-510}{15}\right) \right\}$$

$$\approx 0.13\%$$

That is, under the aforementioned conditions, the sum of formula (1) to formula (4) is discarded as the defectives and is expressed by formula (5).

$$MR=MR1+MR2+MR3+MR4=1.43+0.22+0.04+0.13=1.82\% \tag{5}$$

Now, an expectation of an actual defective occurrence rate against the guaranteed specification 600 μm is expressed by formula (6).

$$MRT = \int_{600}^{\infty} p(x)dx \tag{6}$$

$$= 0.5 - \phi\left(\frac{600-400}{60}\right) = 0.04\%$$

The remaining 1.78% of MR1, MR2 and MR4 components are abolished disregarding essentially non-defectives (referred to as a false notice rate which is defined as a producer's risk rate in the probability theory) to become a cause for reducing productivity.

Also, in the case of the repeat times of at least two under the same conditions, assuming that N is the number of measurement repeat times, the probability is expressed by formula (7).

$$MR=(MR1+MR2)\times 0.4987^N+MR3\times 0.9996^N+MR4\times 0.0013^N=1.65\times 0.4987^N+0.04\times 0.9996^N+96.64\times 0.0013^N \tag{7}$$

Now, in order to bring the false notice rate close to an error 10% of the actual expectation by a simple repeating, as understood by solving an exponential inequality of formula (8), it is required to repeat 9 times. The reduction of the false notice rate by such a processing not only reduces producing ability of a process and an apparatus but also causes a delay of an appointed delivery date.

$$\frac{\left(\begin{array}{c}1.65 \times 0.4987^N + 0.04 \times 0.9996^N + \\ 96.64 \times 0.0013^N\end{array}\right) - 0.04}{0.04} \leq 0.1 \quad (8)$$

SUMMARY OF THE INVENTION

It is therefore an object of the present invention to provide an inspection method of semiconductor integrated circuits in view of the aforementioned problems of the prior art, which is capable of reducing a false notice rate of primarily non-defective semiconductor integrated circuits.

It is another object of the present invention to provide an inspection apparatus of semiconductor integrated circuits, which is capable of reducing a false notice rate of primarily non-defective semiconductor integrated circuits.

In order to attain the objects of the present invention, there is provided an inspection method of semiconductor integrated circuits, in which a distance between predetermined parts of each semiconductor integrated circuit is measured to obtain a measured value and the measured value is compared with a predetermined specification of the distance to discriminate a non-defective/defective of the semiconductor integrated circuit, comprising a parameter reading step for reading the specification, a measuring system error in the measurement and a number N (N: a natural number of at least 2) of repeat times of the measurement; a measuring step for measuring the distance to obtain the measured value: a first inspection step for comparing the measured value obtained in the measuring step with the specification to discriminate the non-defective/defective of the semiconductor integrated circuit: a second inspection step for comparing the measured value discriminated to be defective in the first inspection step with a discrimination reference calculated by adding the measuring system error to the specification to discriminate the non-defective/defective of the semiconductor integrated circuit; an average value calculation step for repeatedly executing the measuring step against the semiconductor integrated circuit which is discriminated to be defective in the first inspection step and to be non-defective in the second inspection step to calculate an average value of the N number of measured values obtained in the N times of repeated measuring steps: and a third inspection step for comparing the average value with the specification to discriminate the non-defective/defective of the semiconductor integrated circuit.

The discrimination reference can be calculated by adding predetermined number M (M: a natural number of at least 1) times as many as the measuring system error to the specification.

According to the present invention, an inspection apparatus of semiconductor integrated circuits, in which a distance between predetermined parts of each semiconductor integrated circuit is measured to obtain a measured value and the measured value is compared with a predetermined specification of the distance to discriminate a non-defective/defective of the semiconductor integrated circuit, comprises parameter reading means for reading the specification, a measuring system error in the measurement and a number N (N: a natural number of at least 2) of repeat times of the measurement: measuring means for measuring the distance to obtain the measured value: first inspection means for comparing the measured value obtained by the measuring means with the specification to discriminate the non-defective/defective of the semiconductor integrated circuit: second inspection means for comparing the measured value discriminated to be defective by the first inspection means with a discrimination reference calculated by adding the measuring system error to the specification to discriminate the non-defective/defective of the semiconductor integrated circuit: average value calculation means for repeatedly executing the measurements against the semiconductor integrated circuit which is discriminated to be defective by the first inspection means and to be non-defective by the second inspection means to calculate an average value of the N number of measured values obtained in the N times of repeated measurements; and third inspection means for comparing the average value with the specification to discriminate the non-defective/defective of the semiconductor integrated circuit.

Hence, according to the present invention, the essential part of the inspection method and apparatus of semiconductor integrated circuits reads the specification, the measuring system error and the number N (N: a natural number of at least 2) of measurement repeat times, measures the distance to obtain the measured value and compares the measured value with the specification so as to execute the non-defective/defective discrimination. The measured value which is determined to be defective in this discrimination is then compared with a new discrimination reference obtained by adding the measuring system error to the specification so as to execute the non-defective/defective discrimination of the semiconductor integrated circuits. Against the semiconductor integrated circuits which are determined to be defective in the comparison with the specification and then to be non-defective in the comparison with the new discrimination reference, the measurement is repeatedly executed until to reach the N times to calculate the average value of the N number of measured values obtained by the N times of measurements. The obtained average value is further compared with the specification so as to execute the non-defective/defective discrimination of the semiconductor integrated circuits. Hence, the semiconductor integrated circuits are not directly determined to be defective by the one measured value including the error and are discriminated by the average value of the N number of measurements. Thus, by averaging the error components, the high accuracy discrimination can be carried out. Hence, the false notice rate due to the miss judgement of the essentially non-defective ICs can be reduced.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENTS

The present invention will now be described in connection with its preferred embodiments with reference to the accompanying drawings, wherein like reference characters designate like or corresponding parts throughout the views and thus the repeated description thereof can be omitted for brevity.

Figure 4:
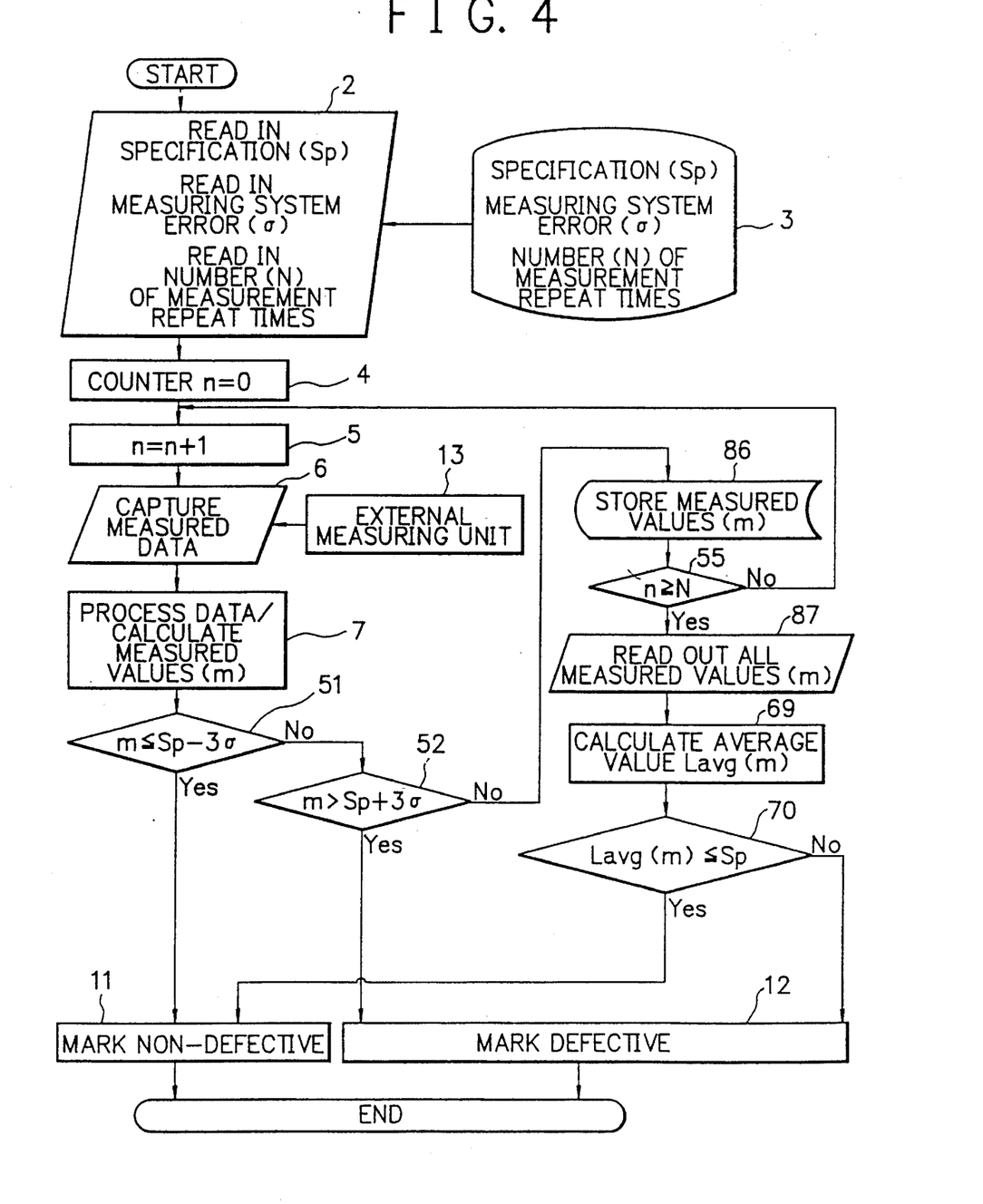
FIG. 4 is a flowchart showing a process of a first embodiment of an inspection method of semiconductor integrated circuits according to the present invention.
Figure 5:
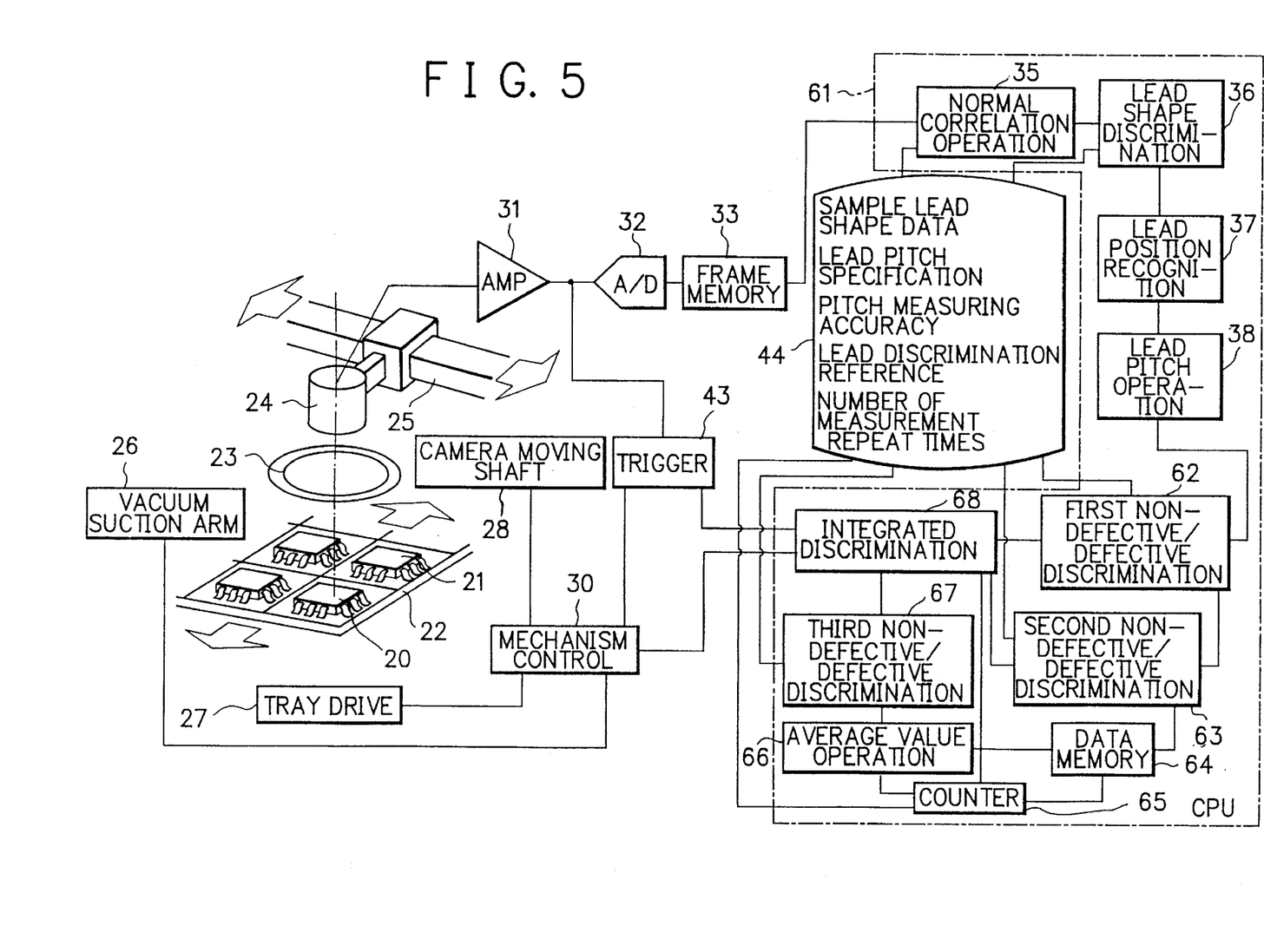
FIG. 5 is a block diagram of an inspection apparatus applicable to the inspection method shown in FIG. 4.

First, FIG. 4 shows a process of the first embodiment of an inspection method of semiconductor integrated circuits according to the present invention and FIG. 5 shows one embodiment of a shape inspection apparatus of lead terminals, which is applicable to the inspection method shown in FIG. 4.

In FIG. 4, there are shown steps of a process for discriminating semiconductor integrated circuits as non-defectives/defectives. As shown in FIG. 4, in step 2, a system reads in a specification Sp for carrying out a non-defective/defective discrimination of ICs (semiconductor integrated circuits) to be inspected in the following steps, a measuring system error σ of an external measuring unit 18 to be used in this inspection, and a number N of measurement repeat times. In step 3, the specification Sp, the measuring system error σ and the number N of measurement repeat times are stored in a memory in advance.

In steps 4 and 5, the measurement times are counted, and an initialization of a counter is executed in step 4, and increment is carried out in step 5 (e.g. similarly to steps 104 and 105 of FIG. 1). In step 6, an objective IC 20 is measured using the external measuring unit 13 to capture measured data (data before processing). In step 7, the measured data read in step 6 are processed to calculate a measured value (representative characteristic value m).

In step 51, that is, a first inspection step, the measured value m obtained in step 7 is compared with a value (Sp-3σ) calculated by subtracting three times as large as the measuring system error σ from the specification Sp read in step 2. When the measured value m is equal to or less than the calculated value (Sp-3σ), the IC is classified as a non-defective. When the measured value m is larger than the calculated value (Sp-3σ) in step 52, the operation moves to step 52. In step 52, that is, a second inspection step, in the case of the IC whose measured value m is larger than the calculated value (Sp-3σ) in step 51, the measured value m is further compared with another value (Sp+3σ) calculated by adding three times the measuring system error σ to the specification Sp. When the measured value m is larger than the calculated value (Sp+3σ), the IC is determined to a defective. When the measured value m is equal to or less than the value (Sp+3σ) in step 52, the operation moves to step 86.

In step 86, the measured values m of the ICs discriminated as non-defective in step 52 are recorded. In step 55, the present measurement times n counted in the steps 4 and 5 is compared with the number N of measurement repeat times read out in step 2 and, when the present measurement times n does not reach the number N of measurement repeat times, the operation returns to step 5 and the above steps 5 to 52 are repeated. When the present measurement times n reaches the number N of measurement repeat times, the operation moves to step 87. In step 87, all the measured values m repeatedly recorded in step 86 are read out. In step 69, an average value Lavg(m) of the measured values m read out in step 87 is calculated.

In step 70, that is, a third inspection step, the average value Lavg(m) of the measured values m of the ICs is compared with the specification Sp read out in step 2. When the average value Lavg(m) is equal to or less than the specification Sp, the IC is classified as a non-defective and, when the average value Lavg(m) is larger than the specification Sp, the IC is a defective.

In step 11, the non-defective ICs determined in step 51 and step 70 are marked with a non-defective, and in step 12, the defective IC s classified in step 52 and 70 are marked with a defective.

As shown in FIG. 5, in the shape inspection apparatus of lead terminals, the operation of the parts correspond to steps of the inspection method shown in FIG. 4. That is, in FIG. 5, a tray drive system 27, a camera moving shaft system 28, a falling illumination source 23, a camera 24, a mechanism control part 30, an AMP (amplifier) 31, and A/D (analog-digital) converter 32 and a frame memory 33 are the external measuring unit 13 and a definite means for executing the data capture step 6 in FIG. 4. Similarly, a vacuum suction arm 26 is an embodying means in the non-defective marking step 11 and the defective marking step 12. A normal correlation operation part 35, a lead shape discrimination part 36, a lead position recognition part 37 and a lead pitch operation part 38 are a concrete means in the data processing/measured value calculation step 7. A first non-defective/defective discrimination part 62 is a definite means in the condition branch step 51, and a second non-defective/defective discrimination part 63 is a concrete means in the condition branch step 52, and a third non-defective/defective discrimination part 67 is a definite means in the condition branch step 70. A counter 65 is an embodying means in steps 4, 5 and 55 of the trace of the measurement times and the condition branch and a data memory 64 is a definite means of step 86 for carrying out the recording of the measured values m and an auxiliary means of the average value calculation step 69. An average value operation part 66 is a concrete means in all measured value read-out step 87 and the average value calculation step 69 and an integrated discrimination part 68 is a definite means for coordinating the operations of the above parts.

Next, the operation of the above-described IC inspection method and the shape inspection apparatus for measuring pitches between the lead terminals (hereinafter referred to as lead pitch) will now be described. In this embodiment, steps 2 to 7 in FIG. 4 and the steps from the imaging of the lead shape image of the IC 20 to the lead pitch operation part 38 and the operations of their parts in FIG. 5 are the same as those of the conventional inspection method and apparatus shown in FIGS. 1 and 2 and thus the description thereof can be omitted for brevity. Hence, on and after step 51 in FIG. 4 and on and after the first non-defective/defective discrimination part 62 in FIG. 5 will be described. Further, similar to the subject in the aforementioned prior art, in accordance with FIG. 3A, a probability density function (pdf) of production ability 80 is expressed as follows:
tiP p(x)=N(400 μm, 60² μm) (N: normal distribution)
The pdf of a basic measuring system error is as follows:

$$q(x)=N(0\ \mu m, 15^2\ \mu m)$$

In place of the aforementioned q1(x), modifications q2(x) and q3(x) of q(x) are used when a guaranteed specification 600 μm is set to a discrimination reference of a measuring system as it is. That is, $$q2(x)=N(600\ \mu m, 15^2\ \mu m)$$

$$q3(x)=N(645\ \mu m, 15^2\ \mu m)$$

In FIG. 5, the first non-defective/defective discrimination part 62 reads a lead pitch m of each part of the IC 20, calculated by the lead pitch operation part 38 and executes a comparison of the lead pitch m with the value (Sp-3σ) calculated by using the specification Sp and the measuring system error σ stored in an external storage device 44 (external storage device 3 in FIG. 4) in step 51 shown in FIG. 4.

As shown in FIG. 3A, Sp is 600 μm and σ is μm, that is, the value (Sp-3σ) is 555 μm, and step 51 in FIG. 4 and the first non-defective/defective discrimination part 62 in FIG. 5 are the step and the means for discriminating definite non-effectives with the lead pitch 555 μm. At this time, the probability for carrying out a false discrimination that a definite defective with the value (Sp-3σ) of at least 645 μm is considered as a definite non-defective is nearly zero and on the contrary, the probability for a false discrimination that a definite non-defective having the lead pitch of at most 555 μmis considered as a definite defective of at least 645 μm is also nearly zero.

The probability (miss detection rate) for executing a false discrimination that a defective against the guaranteed specification of the lead pitch 600 μm to 645 μm is considered as a definite non-defective is expressed in formula (9).

$$\begin{aligned} MR5 &= \int_{600}^{645} p(x) \cdot q1(x)dx \\ &= \left\{ \phi\left(\frac{645-400}{60}\right) - \phi\left(\frac{600-400}{60}\right) \right\} \times \\ &\quad \left\{ \phi\left(\frac{645-555}{15}\right) - \phi\left(\frac{600-555)}{15}\right) \right\} \\ &= 0.39\ \text{ppm} \end{aligned} \tag{9}$$

In the case of the IC 20 whose all the lead pitches are clearly non-defective, the first non-defective/defective discrimination part 62 outputs a signal indicating that the IC 20 is non-defective to the integrated discrimination part 68 and the integrated discrimination part 68 sends a signal of a non-defective storage operation to the mechanism control part 30.

In response to the signal from the integrated discrimination part 68, the mechanism control part 30 gives an instruction to the vacuum suction arm 26, the tray drive system 27 and the camera moving shaft system 28. Thus, the vacuum suction arm 26 keeps its stand-by state above the IC 20 without operating the vacuum suction, and the tray drive system 27 moves the tray 22 forward and backward to position a next IC 21 below the camera 24, and the camera moving shaft system 28 moves the camera 24 left and right along a camera moving shaft 25 only when the IC 20 whose measurement has just finished is the last within the tray 22 so as to position the next IC 21. The above description is a definite operation in step 11 shown in FIG. 4.

Next, in step 12 shown in FIG. 4, the second non-defective/defective discrimination part 63 in FIG. 5 compares the lead pitch m of the IC 20 which is discriminated not to be a clear non-defective in the first non-defective/defective discrimination part 62 with a discrimination reference (Sp+3σ=645 μm) shown in step 52 in FIG. 4 to carry out a discrimination of a definite defective of at least 645 μm.

At this time, the probability (false notice rate) for carrying out a false discrimination that a non-defective with (Sp-3σ) of not at most 555 μm but at most non-defective guaranteed specification 600 μm is considered as a definite defective is expressed in formula (10).

$$\begin{aligned} MR6 &= \int_{555}^{600} p(x) \cdot q3(x)dx \\ &= \left\{ \phi\left(\frac{600-400}{60}\right) - \phi\left(\frac{555-400}{60}\right) \right\} \times \\ &\quad \left\{ \phi\left(\frac{645-555}{15}\right) - \phi\left(\frac{645-600)}{15}\right) \right\} \\ &= 5.85\ \text{ppm} \end{aligned} \tag{10}$$

Even when the IC 20 has at least one clear defective lead pitch, the second non-defective/defective discrimination part 63 outputs a signal indicating that the IC 20 is defective to the integrated discrimination part 68 and the integrated discrimination part 68 gives a signal of a defective storage operation to the mechanism control part 30.

In response to the signal from the integrated discrimination part 68, the mechanism control part 30 gives an instruction to the vacuum suction arm 26, the tray drive system 27 and the camera moving shaft system 28. Hence, the vacuum suction arm 26 adsorbs the defective IC 20 and carries it to a defective storage area out of the tray 22 to store it there, and the tray drive system 27 and the camera moving shaft system 28 operate in the same manner as described above.

The above description is the definite operation in step 12 shown in FIG. 4.

The data memory 64 in FIG. 5 is a device for embodying the work in step 86 in FIG. 4. That is, when the first non-defective/defective discrimination part 62 discriminates that the lead pitches of all the pins of the IC 20 are not clearly non-defective and the second non-defective/defective discrimination part 63 then discriminates that none of the lead pitches of the pins of the IC 20 is definitely defective, the data memory 64 stores the measured values m of not clearly non-defective in the IC 20 every lead number/every measurement time. During the repeat measurements, concerning the lead once discriminated as the definite non-defective, the data memory 64 clears the data theretofore and does not store any of the following data.

The counter 65 in FIG. 5 is a device for embodying the work in steps 4 and 5 and the step 55. When the first non-defective/defective discrimination part 62 discriminates that the lead pitches of all the pins of the IC 20 are not clearly non-defective and the second non-defective/defective discrimination part 63 then discriminates that none of the o lead pitches of the pins of the IC 20 is definitely defective, the counter 65 outputs a remeasurable signal to the integrated discrimination part 68 until the measurement times n reaches the number N of measurement repeat times stored in the external storage device 44 (external storage device 3 in FIG. 4) and, when the present measurement times n reaches the number N of measurement repeat times, the counter 65 outputs an unremeasurable signal to the integrated discrimination part 68.

The average value operation part 66 in FIG. 5 is a device for embodying the work of all measured value readout step 87 and the average value calculation step 69. That is, the average value operation part 66 reads all the data out of the data memory 64 storing all the result of the N times of repeat measurement determined by the counter 65 and divides all the data by N to calculate average values of the pitches every lead number.

Relating to the lead once discriminated to be the definite non-defective during the N times of repeat measurements, because of already being considered as the non-defective, this is not dealt with in the average value operation part 66. Further, similarly, when there is the lead once discriminated to be the definite defective in the N times of repeat measurements, since this is stored as the defective in step 52 shown in FIG. 4 by the second non-defective/defective discrimination part 63, it is needless to consider it here.

The third non-defective/defective discrimination part 67 in FIG. 5 compares each average value Lavg(m) of the average value lead pitches of the N times of measured values (m1 to mN) calculated every lead number in the average value operation part 66 with the specification Sp stored in the external storage device 44 (external storage device 3 in FIG. 4) in step 70 shown in FIG. 4. When the average value Lavg(m) is equal to or less than the specification Sp, the third non-defective/defective discrimination part 67 discriminates that this IC 20 is non-defective and, when the average value Lavg(m) is larger than the specification Sp, the IC 20 is discriminated to be defective. According to FIG. 3A, it is discriminated that, when the average value Lavg(m) is equal to or less than 600 μm, the IC 20 is non-defective and, when the average value Lavg(m) is larger than 600 μm, the IC 20 is defective.

Now, for example, assuming that the number N of measurement repeat times is five, the probability (false notice rate) for carrying out a false defective discrimination of the IC 20 notwithstanding its essentially non-defective with respect to the guaranteed specification 600 μm is represented by formula (11).

$$MR7 = \int_{579.9}^{600} p(x) \cdot q4(x)dx \qquad (11)$$

$$= \left\{ \phi\left(\frac{600-400}{60}\right) - \phi\left(\frac{579.9-400}{60}\right) \right\} \times$$

$$\phi\left(\frac{600-579.9}{6.7}\right)$$

$$= 448.8 \text{ ppm}$$

Further, the probability (miss detection rate) for carrying out a false non-defective discrimination of the IC 20 despite its essentially non-defective with respect to the guaranteed specification 600 μm is shown by formula (12).

$$MR8 = \int_{600}^{620.1} p(x) \cdot q4(x)dx \qquad (12)$$

$$= \left\{ \phi\left(\frac{620.1-400}{60}\right) - \phi\left(\frac{600-400}{60}\right) \right\} \times$$

$$\phi\left(\frac{620.1-600}{6.7}\right)$$

$$= 99.7 \text{ ppm}$$

Figure 3B:
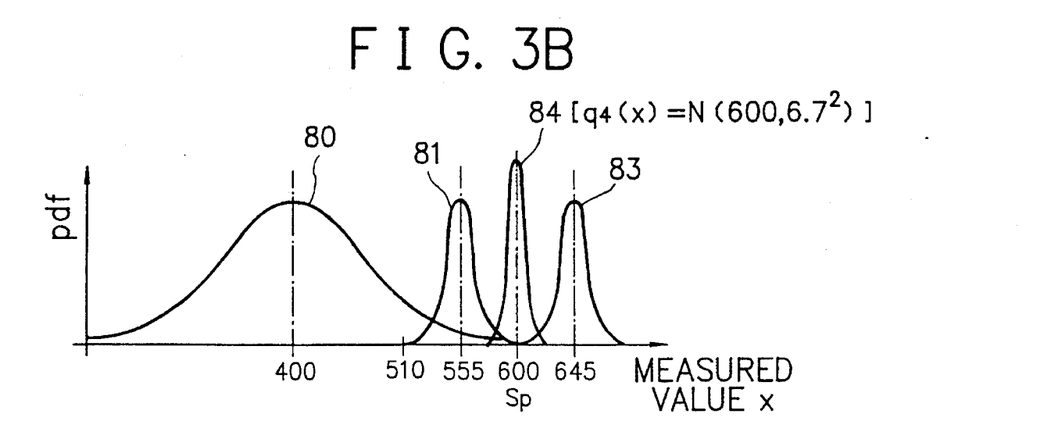
FIG. 3B is a graphical representation showing a relationship between probability density functions and measuring system errors as a discrimination reference of a first embodiment of the present invention.

Although q4(x) is newly used in the above formulae (11) and (12), this gives the effect based on the central limit theorem when the average value is repeatedly collected five times in q2(x) shown in FIG. 3A and at this time, a discrimination reference in step 70 is shown in FIG. 3B. Its conversion is shown in formulae (13).

$$\begin{array}{rl} \text{When } N=1, q2(x) & = N(600, 15^2) \\ \text{When } N=5, q4(x) & = N(600, (15/\sqrt{5})^2) \\ & = N(600, 6.7^2) \end{array} \qquad (13)$$

The IC 20 discriminated to be non-defective in the second non-defective/defective discrimination part 63 or the IC 20 discriminated to be defective is processed by the mechanism control part 30 in the same manner as the IC 20 discriminated to be definitely non-defective in the first non-defective/defective discrimination part 62 or the IC 20 discriminated to be definitely defective in the second non-defective/defective discrimination part 63, respectively.

When the inspection of the lead pitches is executed according to the inspection method using the above inspection apparatus, in the case of five measurement repeat times, tile miss detection rate and the false notice rate are represented in formulae (14).

Miss detection rate=0.39+99.7≈100 ppm

False notice rate=5.85+448+8≈455 ppm  (14)

Figure 6:
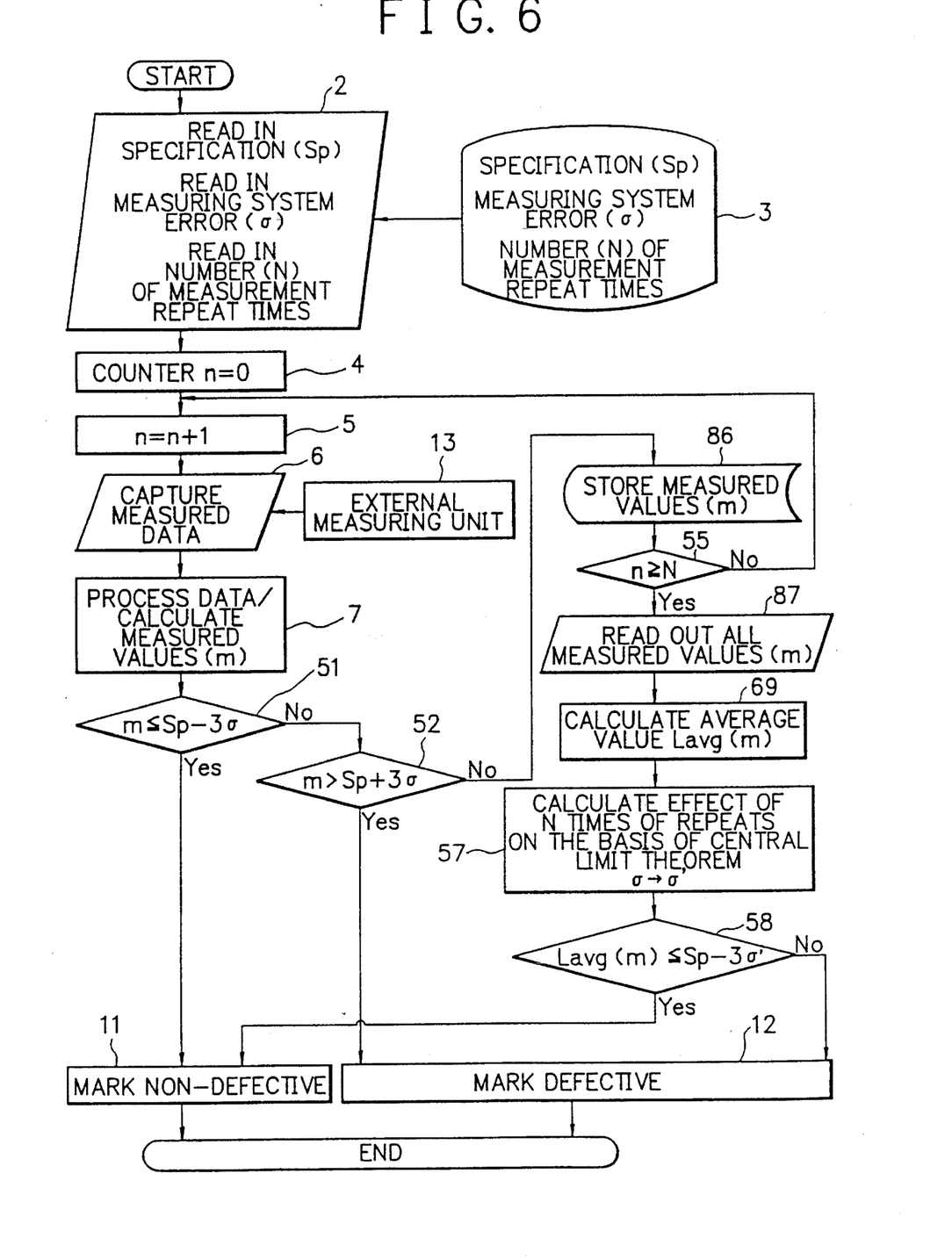
FIG. 6 is a flowchart showing a process of a second embodiment of an inspection method of semiconductor integrated circuits according to the present invention.

Next, FIG. 6 illustrates a process of the second embodiment of an inspection method of semiconductor integrated circuits according to the present invention.

In this embodiment, as shown in FIG. 6, steps 2, 3, 4, 5, 6, 7, 11, 12, 13, 51, 52, 55, 69, 86 and 87 are the same as those of the first embodiment shown in FIG. 4 and thus the description thereof can be omitted for brevity. Also, a shape inspection apparatus for definitely realizing this embodiment corresponds to the first embodiment of the inspection method shown in FIG. 4 and, since the shape inspection apparatus of IC lead pitches shown in FIG. 5 is equivalent to the block diagram, the inspection apparatus will be described in connection with FIG. 5.

In FIG. 6, the average value Lavg(m) is obtained by the N times of measurement repeats of the lead pitches which are not definitely non-defective and not definitely defective in the work in steps 2 to 69 in the same manner as the first embodiment described above.

In this embodiment, in an operation step 57, a variance of a normal distribution of the measuring system is calculated depending on the number N of measurement repeat times on the basis of the above-described central limit theorem and in an example of N=5 times, it can be assumed that the variance $15^2$ at one measurement is reduced to $6.7^2$, as shown in the aforementioned formulae (13). This work is executed by the third non-defective/defective discrimination part 67 in FIG. 5 in the definite apparatus.

Figure 3C:
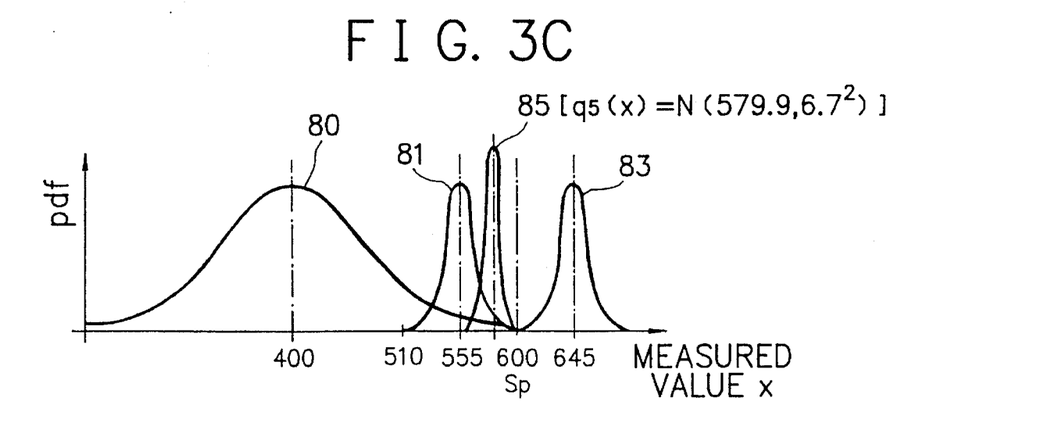
FIG. 3C is a graphical representation showing a relationship between probability density functions and measuring system errors as a discrimination reference of a second embodiment of the present invention.

The third non-defective/defective discrimination part 67 then executes a comparison discrimination in a condition branch step 58 in FIG. 6. Under the same conditions as the first embodiment, referring to FIG. 3C showing a discrimination reference in step 58, a position where a margin of 6.7×3=20.1 μm is set against the guaranteed specification 600 μm is a non-defective/defective discrimination reference.

At this time, the probability (miss detection rate) for executing a false discrimination that a defective of more than 600 μm and at most 645 μm is determined at most 600 μm by mistake is represented in formula (15).

$$MR9 = \int_{600}^{645} p(x) \cdot q5(x)dx \quad (15)$$

$$= \left\{ \phi\left(\frac{645-400}{60}\right) - \phi\left(\frac{600-400}{60}\right) \right\} \times$$

$$\left\{ \phi\left(\frac{645-579.9}{6.7}\right) - \phi\left(\frac{600-579.9}{6.7}\right) \right\}$$

$$= 0.36 \text{ ppm}$$

Similarly, the probability (false notice rate) for executing a false discrimination that a non-defective of more than 555 µm and at most 600 µm is determined to a defective by mistake is shown in formula (16).

$$MR10 = \int_{555}^{600} p(x) \cdot q5(x)dx \quad (16)$$

$$= \left\{ \phi\left(\frac{600-400}{60}\right) - \phi\left(\frac{555-400}{60}\right) \right\} \times$$

$$\left\{ 0.5 + \phi\left(\frac{600-579.9}{6.7}\right) \right\}$$

$$= 0.45\%$$

Now, the false notice rate and miss detection rate of the measured value of at most 555 µm and the measured value lager than 645 µm are similar to those of the first embodiment and hence the total false notice rate and miss detection rate are shown in the following formulae (17) and (17').

Miss detection rate=0.39+0.36≈0.75 ppm    (17)

False notice rate=5.85 ppm+0.45% ≈0.45%    (17')

In this embodiment, the false notice rate (consumer's risk rate) can further be reduced in comparison with the first embodiment.

In Table 1, there are shown the false notice rate, the miss detection rate and the number of measurement repeat times of the present invention compared with the prior art.

TABLE 1

|  | Number of measurement repeat times | False notice rate | Miss detection rate |
| --- | --- | --- | --- |
| Prior art | 9 times | 17,800 | 52 |
| Example 1 | 5 times | 455 | 100 |
| Example 2 | 5 times | 4,500 | 0.75 |

As apparent from the above description, according to the present invention, the essential part of the inspection method and apparatus of semiconductor integrated circuits reads the specification, the measuring system error and the number N of measurement repeat times, calculates the distance measured value and compares the measured value with the specification so as to execute the first non-defective/defective discrimination. The measured value which is determined to be defective in the first discrimination is then compared with a new discrimination reference obtained by adding the measuring system error to the specification so as to execute the second non-defective/defective discrimination. Against the semiconductor integrated circuits which are determined to be defective in the first discrimination and then to be non-defective in the second discrimination, the up to N times of measurements are repeatedly executed to calculate the average value of the N number of measured values. The obtained average value is further compared with the specification so as to execute the third non-defective/defective discrimination. Hence, the semiconductor integrated circuits is not directly determined to be defective by the first measured value including the error and the ones having the value within a predetermined measured value are finally discriminated by the average value of the N number of measurements. Thus, on the ones having the measured value close to the specification, their non-defective/defective status is discriminated by the highly accurate process averaging the error components. Hence, by this process, the false notice rate due to the miss judgement of the essentially non-defective IC s can be reduced. By reconstructing the existing discrimination apparatus a little, the selection of the products with high reliability can be performed.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A method of inspecting semiconductor integrated circuits, in which a distance between predetermined parts of each semiconductor integrated circuit is measured to obtain a measured value and the measured value is compared with a predetermined specification of the distance to discriminate a non-defective/defective status of the semiconductor integrated circuit, comprising:

a parameter reading step for reading the specification, a measuring system error, made by a measuring system, in the measurement and a number N (N: a natural number of at least 2) of repeat times of the measurement;

a measuring step for measuring the distance to obtain the measured value;

a first inspection step for comparing the measured value obtained in the measuring step with the predetermined specification to discriminate the non-defective/defective status of the semiconductor integrated circuit, wherein when a difference greater than a predetermined value exists between the measured value and the predetermined specification, the difference is indicative of a defective status and wherein when a difference less than said predetermined value exists between the measured value and the predetermined specification, the difference is indicative of a non-defective;

a second inspection step for comparing the measured value, discriminated to be defective in the first inspection step, with a discrimination reference, said discrimination reference being calculated by adding the measuring system error to the specification to discriminate the non-defective/defective status of the semiconductor integrated circuit;

an average value calculation step for repeatedly executing the measuring step for the semiconductor integrated circuit which is discriminated to be defective in the first inspection step and to be non-defective in the second inspection step to calculate an average value of the N number of measured values obtained in the N times of repeated measuring steps; and a third inspection step for comparing the average value with the specification to discriminate the non-defective/defective of the semiconductor integrated circuit.

2. The inspection method of claim 1, wherein the discrimination reference is calculated by adding a predetermined number M (M: a natural number of at least 1) times as many as the measuring system error to the specification.

3. A method according to claim 1, wherein said measuring system error comprises a stochastic standard deviation from a true value of an object, when the object is measured by the measuring system.

4. A method according to claim 1, wherein said first inspection step includes determining whether or not the measured value is less than or equal to the predetermined specification less 3 times the measuring system error, and wherein when said measured value is less than or equal to said predetermined specification less 3 times the measuring system error, said status of the integrated circuit is non-defective.

5. A method according to claim 1, wherein said second inspection step includes determining whether or not the measured value is greater than or equal to the predetermined specification added to 3 times the measuring system error, and wherein when said measured value is greater than or equal to said predetermined specification added to 3 times the measuring system error, said status of the integrated circuit is defective.

6. A method according to claim 1, wherein said third inspection step includes determining whether or not the average value is less than or equal to the predetermined specification, and wherein when said average value is less than or equal to said predetermined specification, said status of the integrated circuit is non-defective.

7. A method according to claim 1, wherein said first inspection method method uses a criteria m−3σ related to the predetermined specification in determining whether said semiconductor integrated circuit has a status of defective or non-defective, said second inspection method uses a criteria m+3σ related to the predetermined specification in determining whether said semiconductor integrated circuit has a status of defective or non-defective, and said third inspection method uses a criteria the average of all measured values m related to the predetermined specification in determining whether said semiconductor integrated circuit has a status of defective or non-defective, wherein m is the measured value and σ is the measuring system error.

8. An apparatus for inspecting semiconductor integrated circuits, in which a distance between predetermined parts of each semiconductor integrated circuit is measured to obtain a measured value and the measured value is compared with a predetermined specification of the distance to discriminate a non-defective/defective status of the semiconductor integrated circuit, comprising:

parameter reading means for reading the specification, a measuring system error in the measurement and a number N (N: a natural number of at least 2) of repeat times of the measurement;

measuring means for measuring the distance to obtain the measured value;

first inspection means for comparing the measured value obtained by the measuring means with the specification to discriminate the non-defective/defective status of the semiconductor integrated circuit, wherein when a difference greater than a predetermined value exists between the measured value and the predetermined specification, the difference is indicative of a defective status and wherein when a difference less than said predetermined value exists between the measured value and the predetermined specification, the difference is indicative of a non-defective;

second inspection means for comparing the measured value discriminated to be defective by the first inspection means with a discrimination reference calculated by adding the measuring system error to the specification to discriminate the non-defective/defective status of the semiconductor integrated circuit;

average value calculation means for repeatedly executing the measurements against the semiconductor integrated circuit which is discriminated to be defective by the first inspection means and to be non-defective by the second inspection means to calculate an average value of the N number, of measured values obtained in the N times of repeated measurements; and third inspection means for comparing the average value with the specification to discriminate the non-defective/defective status of the semiconductor integrated circuit.

9. An apparatus according to claim 8, wherein said measuring system error comprises a stochastic standard deviation from a true value of an object, when the object is measured by the measuring system.

10. An apparatus according to claim 8, wherein said first inspection means includes means for determining whether or not the measured value is less than or equal to the predetermined specification less 3 times the measuring system error, and wherein when said measured value is less than or equal to said predetermined specification less 3 times the measuring system error, said first inspection means determines a status of the integrated circuit as non-defective.

11. An apparatus according to claim 8, wherein said second inspection means includes means for determining whether or not the measured value is greater than or equal to the predetermined specification added to 3 times the measuring system error, and wherein when said measured value is greater than or equal to said predetermined specification added to 3 times the measuring system error, said second injection means determines a status of the integrated circuit as defective.

12. An apparatus according to claim 8, wherein said third inspection means includes means for determining whether or not the average value is less than or equal to the predetermined specification, and wherein when said average value is less than or equal to said predetermined specification, said third inspection means determines the status of the integrated circuit as non-defective.

13. An apparatus according to claim 8, wherein said first inspection means uses a criteria m−3σ related to the predetermined specification in determining whether said semiconductor integrated circuit has a status of defective or non-defective, said second inspection means uses a criteria m+3σ related to the predetermined specification in determining whether said semiconductor integrated circuit has a status of defective or non-defective, and said third inspection means uses a criteria the average of all measured values m related to the predetermined specification in determining whether said semiconductor integrated circuit has a status of defective or non-defective, wherein m is the measured value and σ is the measuring system error.

* * * * *